US007827432B2

(12) United States Patent
Chang

(10) Patent No.: US 7,827,432 B2
(45) Date of Patent: *Nov. 2, 2010

(54) PHASE FREQUENCY DETECTOR WITH LIMITED OUTPUT PULSE WIDTH AND METHOD THEREOF

(75) Inventor: Hsiang-Hui Chang, Taipei Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/169,621

(22) Filed: Jul. 8, 2008

(65) Prior Publication Data

US 2008/0265945 A1 Oct. 30, 2008

Related U.S. Application Data

(63) Continuation of application No. 11/278,814, filed on Apr. 6, 2006, now Pat. No. 7,412,617.

(51) Int. Cl.
*G06F 1/04* (2006.01)
(52) U.S. Cl. .................... 713/503; 713/400; 713/500
(58) Field of Classification Search ......... 713/400–501, 713/503; 327/3, 5, 7, 24, 26
See application file for complete search history.

(56) References Cited

U.S. PATENT DOCUMENTS

| 5,592,113 | A | * | 1/1997 | Quiet et al. ............... 327/158 |
| 5,977,801 | A | | 11/1999 | Boerstler |
| 6,239,632 | B1 | | 5/2001 | Moyal |
| 6,501,259 | B1 | | 12/2002 | Cheng |
| 6,516,422 | B1 | * | 2/2003 | Doblar et al. ............... 713/503 |
| 6,590,949 | B1 | | 7/2003 | Marten |
| 6,850,051 | B2 | | 2/2005 | Roberts |
| 2002/0163325 | A1 | | 11/2002 | Nilsson |
| 2004/0239386 | A1 | | 12/2004 | Lim |
| 2006/0119405 | A1 | | 6/2006 | Kobayashi |
| 2006/0214698 | A1 | * | 9/2006 | Cho ............................ 327/3 |

FOREIGN PATENT DOCUMENTS

| TW | 453041 | 9/2001 |
| TW | 538596 | 6/2003 |
| TW | 200509537 | 3/2005 |

* cited by examiner

*Primary Examiner*—Dennis M Butler
(74) *Attorney, Agent, or Firm*—Winston Hsu; Scott Margo; Min-Lee Teng

(57) ABSTRACT

Phase frequency detectors with limited output pulse width and related methods are provided. On exemplary phase frequency detector includes a first edge detector, a second edge detector, and a pulse reshaping controller. The first edge detector is for detecting first-type edges of a first signal to generate a first detection signal. The second edge detector is for detecting the first-type edges of a second signal to generate a second detection signal. The pulse reshaping controller is for receiving the first detection signal and the second detection signal, and for generating a first control signal to the first edge detector and generating a second control signal to the second edge detector. In addition, the pulse reshaping controller further generates a first output signal and a second output signal, wherein a pulse width of the first output signal is limited by the pulse reshaping controller.

14 Claims, 4 Drawing Sheets

PHASE FREQUENCY DETECTOR WITH LIMITED OUTPUT PULSE WIDTH AND METHOD THEREOF

CROSS REFERENCE TO RELATED APPLICATIONS

This continuation application claims the benefit of co-pending U.S. patent application Ser. No. 11/278,814, filed on Apr. 6, 2006 and included herein by reference.

BACKGROUND

The present disclosure relates to phase frequency detectors, and more particularly, to phase frequency detectors having limited output pulse width.

Phase-locked loop (PLL) can be applied in a variety of applications, such as clock/data recovery, frequency or phase modulation/demodulation, and generating clocks with stable frequency. In general, a conventional PLL includes a phase frequency detector (PFD) for detecting phase difference and frequency difference between a reference signal and a feedback signal; a charge-pump for generating an output current according to the detection result of the PFD; and a loop filter for adjusting the operation of a voltage-controlled oscillator (VCO) according to the output current until the frequency and phase of the feedback signal match that of the reference signal.

Typically, the loop bandwidth of the conventional PLL is designed one order of magnitude less than the frequency of the reference signal in order to maintain the loop stability. As the frequency of the reference signal decreases, the loop bandwidth of the PLL should be lowered correspondingly. In such a scheme, a large capacitor is required by the loop filter to suppress the jitter of the VCO. As a result, the circuitry area and volume is significantly increased.

SUMMARY

It is therefore an objective of the present disclosure to provide phase frequency detectors having limited output pulse width and associated methods to solve the above-mentioned problems.

An exemplary embodiment of a phase frequency detector is disclosed. The phase frequency detector includes: a first edge detector for detecting first-type edges of a first signal to generate a first detection signal; a second edge detector for detecting the first-type edges of a second signal to generate a second detection signal; and a pulse reshaping controller for receiving the first detection signal and the second detection signal. The pulse reshaping controller generates a first control signal to the first edge detector and a second control signal to the second edge detector; in addition, the pulse reshaping controller further generates a first output signal and a second output signal, wherein a pulse width of the first output signal is limited by the pulse reshaping controller.

Another exemplary embodiment of a phase frequency detector is disclosed. The phase frequency detector includes: a first edge detector for detecting an edge of a first signal to generate a first detection signal; a second edge detector for detecting an edge of a second signal to generate a second detection signal; and a pulse reshaping controller for generating a first output signal and a second output signal according to the first and the second detection signal. A pulse width difference between the first output signal and the second output signal represents an equivalent output pulse width, and the equivalent output pulse width is clamped when a phase difference between the first signal and the second signal exceeds a predetermined degree.

An exemplary embodiment of a method for phase frequency detection is disclosed. The method includes: detecting an edge of a first signal to generate a first output signal; detecting an edge of a second signal to generate a second output signal, wherein a pulse width difference between the first output signal and the second output signal represents an equivalent output pulse width; delaying at least one of the first and the second output signal and generating at least a control signal; and limiting the equivalent output pulse width according to at least the control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
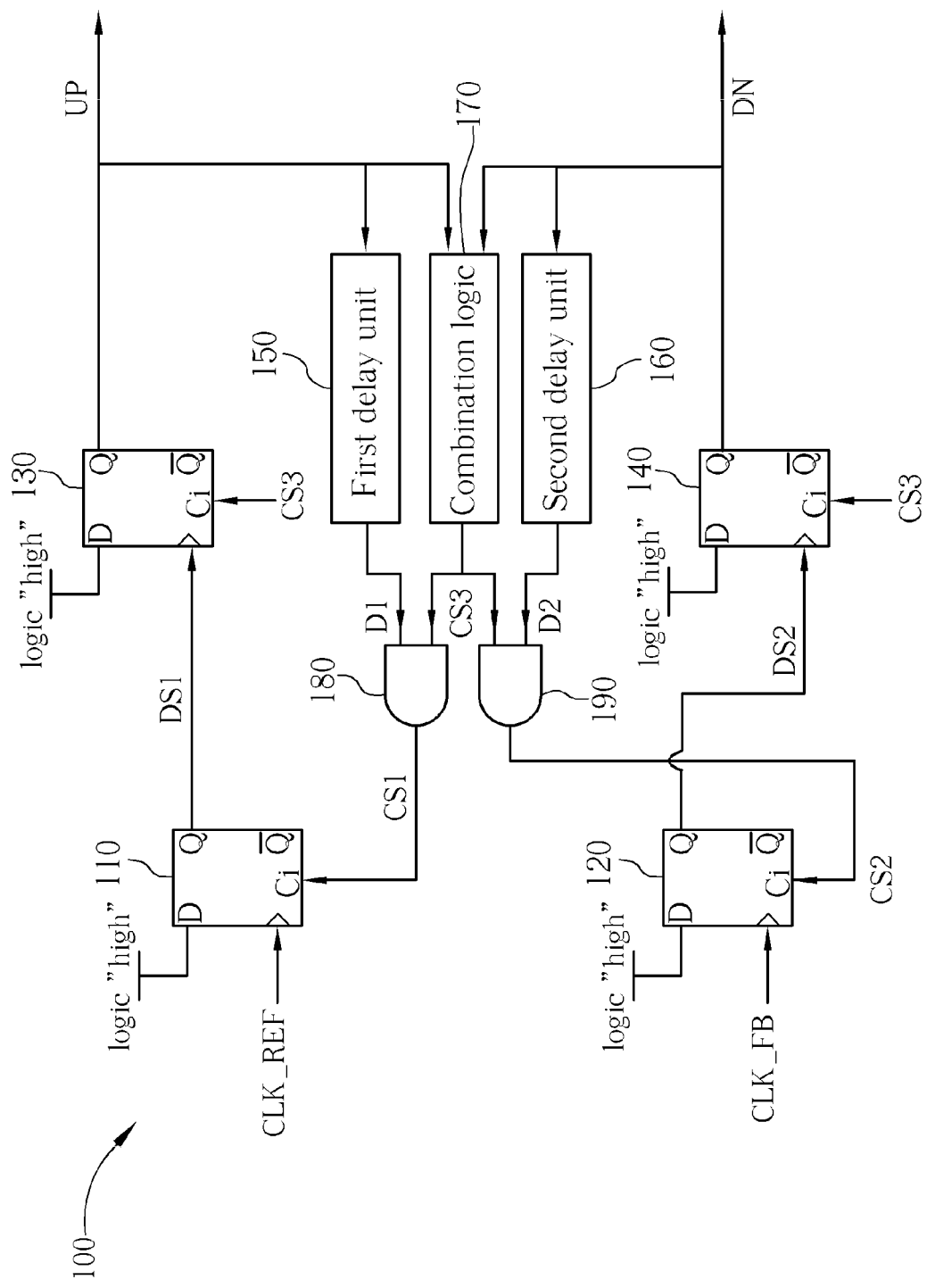
FIG. 1 is a block diagram of a phase frequency detector for use in a phase-locked loop (PLL) according to an exemplary embodiment.

Please refer to FIG. 1, which shows a block diagram of a phase frequency detector 100 for use in a phase-locked loop (PLL) according to an exemplary embodiment. The phase frequency detector 100 comprises combination logic 170, two edge detectors 110 and 120, two latch units 130 and 140, two delay units 150 and 160, and two logic units 180 and 190. As shown, the first latch unit 130 is coupled to the first edge detector 110 and the first delay unit 150; the second latch unit 140 is coupled to the second edge detector 120 and the second delay unit 160; the combination logic 170 is coupled to the first latch unit 130 and the second latch unit 140; the first logic unit 180 is coupled to the first edge detector 110, the first delay unit 150, and the combination logic 170; and the second logic unit 190 is coupled to the second edge detector 120, the second delay unit 160, and the combination logic 170.

In operations, the phase frequency detector 100 receives a reference signal CLK_REF and a feedback signal CLK_FB, which is generated from the PLL, and generates two output signals UP and DN to control the charge/discharge operation of a charge pump, which is the following stage of the phase frequency detector 100. Hereinafter, implementations and operations of the components of the phase frequency detector 100 will be described in more detail.

The first edge detector 110 is arranged for detecting first-type edges of the reference signal CLK_REF to generate a first detection signal DS1, and for changing the level of the first detection signal DS1 according to a first control signal CS1. The second edge detector 120 is arranged for detecting the first-type edges of the feedback signal CLK_FB to generate a second detection signal DS2, and for changing the level of the second detection signal DS2 according to a second control signal CS2. In practice, the first-type edges mentioned above are either rising edges or falling edges.

Preferably, the edge detectors 110 and 120 are edge-trigger edge detectors. In one embodiment, the first and second control signals CS1 and CS2 serve as reset signals for respectively resetting the first edge detector 110 and the second edge detector 120. In such a scheme, the first edge detector 110 sets the first detection signal DS1 to logic low during the active period of the first control signal CS1, and the second edge detector 120 sets the second detection signal DS2 to logic low during the active period of the second control signal CS2. In practice, both the first control signal CS1 and the second control signal CS2 may be low active, but this is merely an example rather than a restriction of the practical implementations.

In the phase frequency detector 100, the first latch unit 130 is arranged for latching the first detection signal DS1 to generate a first output signal UP, and the second latch unit 140 is arranged for latching the second detection signal DS2 to generate a second output signal DN. In addition, the first latch unit 130 changes the level of the first output signal UP according to a third control signal CS3. Similarly, the second latch unit 140 changes the level of the second output signal DN according to the third control signal CS3. In this embodiment, the third control signal CS3 serves as a reset signal for resetting both the first latch unit 130 and the second latch unit 140. Thus, during the active period of the third control signal CS3, the first latch unit 130 and the second latch unit 140 respectively set the first output signal UP and the second output signal DN to logic low state. Preferably, the third control signal CS3 is low active, but this is merely an example rather than a restriction of the practical implementations.

In a preferred embodiment, the edge detectors 110 and 120 are implemented with D-type flip-flops as illustrated in FIG. 1. As shown in FIG. 1, the first edge detector 110 comprises a data input terminal coupled to logic "high"; a clock input terminal coupled to the reference signal CLK_REF; a data output terminal for providing the first detection signal DS1; and a control input terminal Ci coupled to the first control signal CS1. Similarly, the second edge detector 120 comprises a data input terminal coupled to logic "high"; a clock input terminal coupled to the feedback signal CLK_FB; a data output terminal for providing the second detection signal DS2; and a control input terminal Ci coupled to the second control signal CS2.

Additionally, the first and second latch units 130 and 140 may also be implemented with D-type flip-flops as shown in FIG. 1. In this embodiment, the first latch unit 130 comprises a data input terminal coupled to logic "high"; a clock input terminal coupled to the data output terminal of the first edge detector 110 for receiving the first detection signal DS1; a data output terminal for providing the first output signal UP; and a control input terminal Ci coupled to the third control signal CS3. The second latch unit 140 comprises a data input terminal coupled to logic "high"; a clock input terminal coupled to the data output terminal of the second edge detector 120 for receiving the second detection signal DS2; a data output terminal for providing the second output signal DN; and a control input terminal Ci coupled to the third control signal CS3.

The first delay unit 150 is arranged for applying a first delay on the first output signal UP to generate a first delayed signal D1. The second delay unit 160 is arranged for applying a second delay on the second output signal DN to generate a second delayed signal D2. In a preferred embodiment, the first delay and the second delay are substantially the same, so the first and second delay units 150 and 160 can be designed substantially the same. Please note that this configuration is merely a preferred embodiment and not a restriction of the practical implementations. For example, in another embodiment, the phase frequency detector 100 further comprises a delay setting unit (not shown) coupled to the first delay unit 150 and/or the second delay unit 160 for programming the first and/or second delay.

On the other hand, the combination logic 170 is designed for performing a predetermined logical operation on the first output signal UP and the second output signal DN to produce the third control signal CS3, which is employed to control the first and second latch units 130 and 140. For example, the combination logic 170 may perform a logic AND operation on the first output signal UP and the second output signal DN to generate the third control signal CS3.

In the phase frequency detector 100, the first logic unit 180 is employed for performing a first logical operation on the first delayed signal D1 and the third control signal CS3 to generate the first control signal CS1, and the second logic unit 190 is employed for performing a second logical operation on the second delayed signal D2 and the third control signal CS3 to generate the second control signal CS2. Preferably, the first and second logical operations are substantially the same. For example, each of the first logic unit 180 and the second logic unit 190 of this embodiment is realized by a logic AND gate as shown in FIG. 1.

Figure 2:
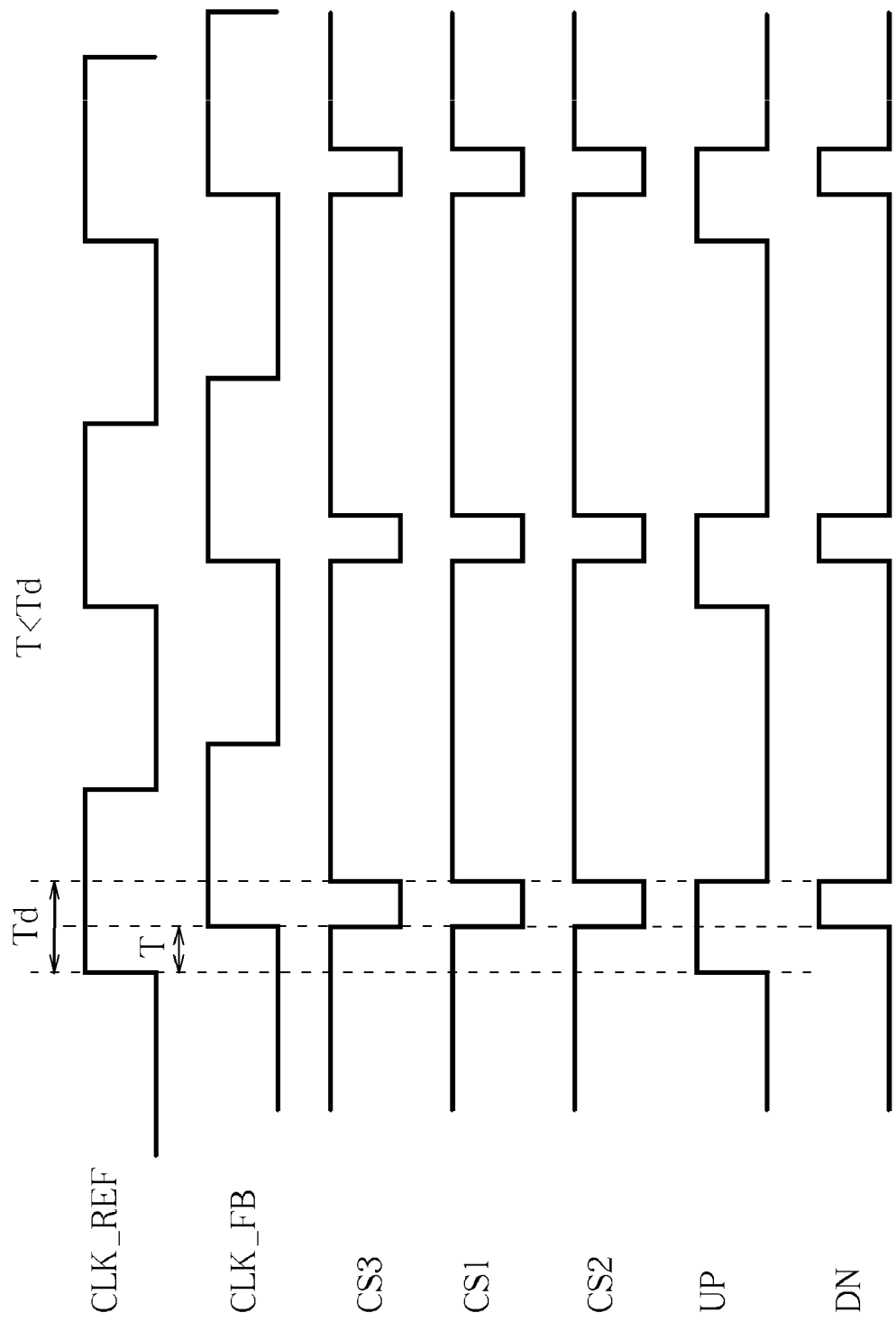
FIG. 2 and FIG. 3 are timing diagrams illustrating the operations of the phase frequency detector of FIG. 1 with respect to different cases.
Figure 3:
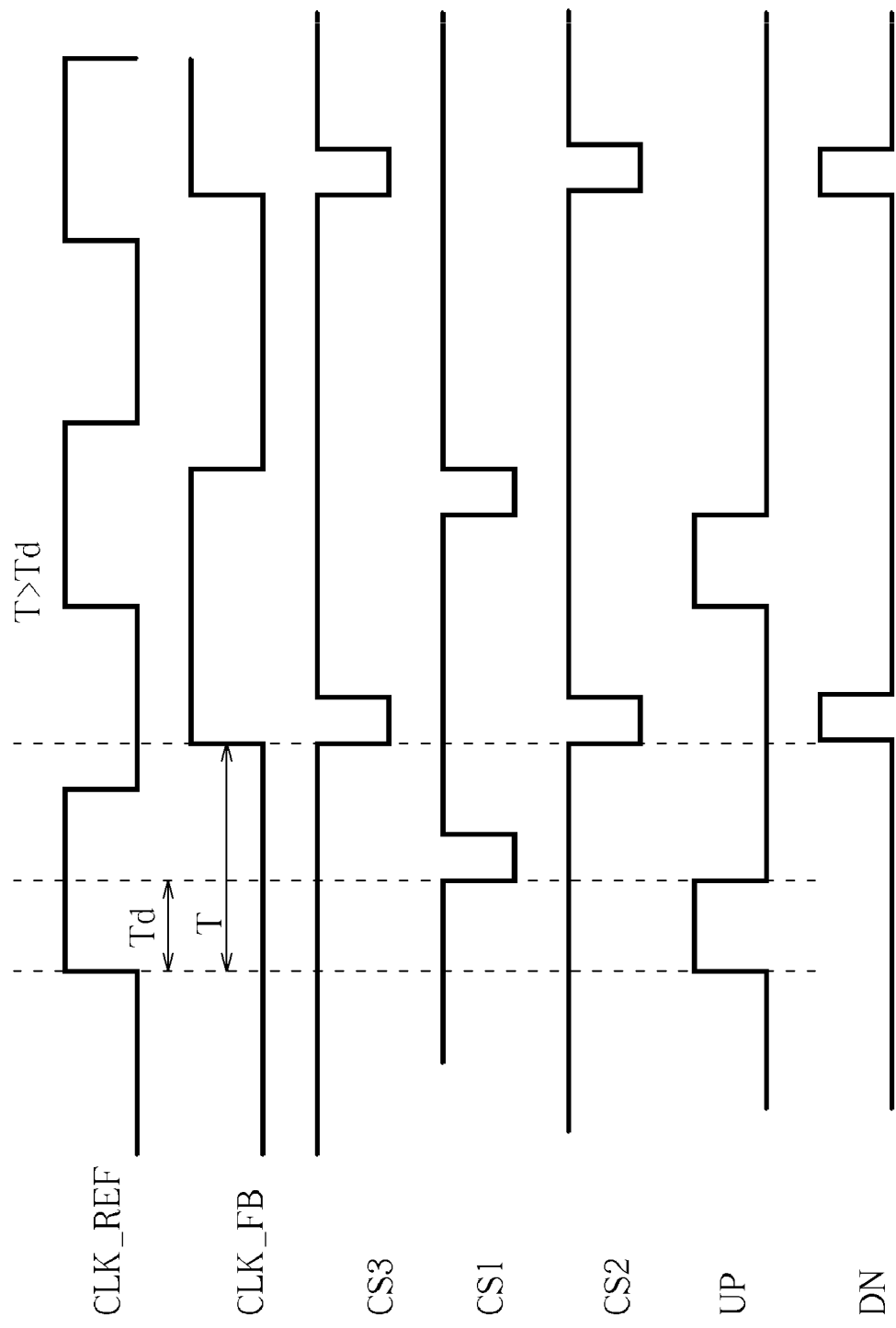

Please refer to FIG. 2 and FIG. 3, which are timing diagrams illustrating the operations of the phase frequency detector 100 with respect to different cases. For the purpose of explanatory convenience in the following description, it is herein assumed that the first delay provided by the first delay unit 150 and the second delay provided by the second delay unit 160 are both Td. As illustrated in FIG. 2, in the case where a phase difference T between the reference signal CLK_REF and the feedback signal CLK_FB is less than the delay Td provided by the first and second delay units 150 and 160, the equivalent output pulse width of the phase frequency detector 100 is proportional to the phase difference T between the reference signal CLK_REF and the feedback signal CLK_FB. Specifically, the difference between the first output signal UP and the second output signal DN is proportional to the phase difference T.

On the contrary, as illustrated in FIG. 3, in the case where the phase difference T between the reference signal CLK_REF and the feedback signal CLK_FB is greater than the delay Td of the first and second delay units 150 and 160, the pulse width of the first output signal UP is limited in the delay Td and not proportional to the phase difference T between the reference signal CLK_REF and the feedback signal CLK_FB. In other words, the phase frequency detector 100 has a limited equivalent output pulse width under such a situation.

Figure 4:
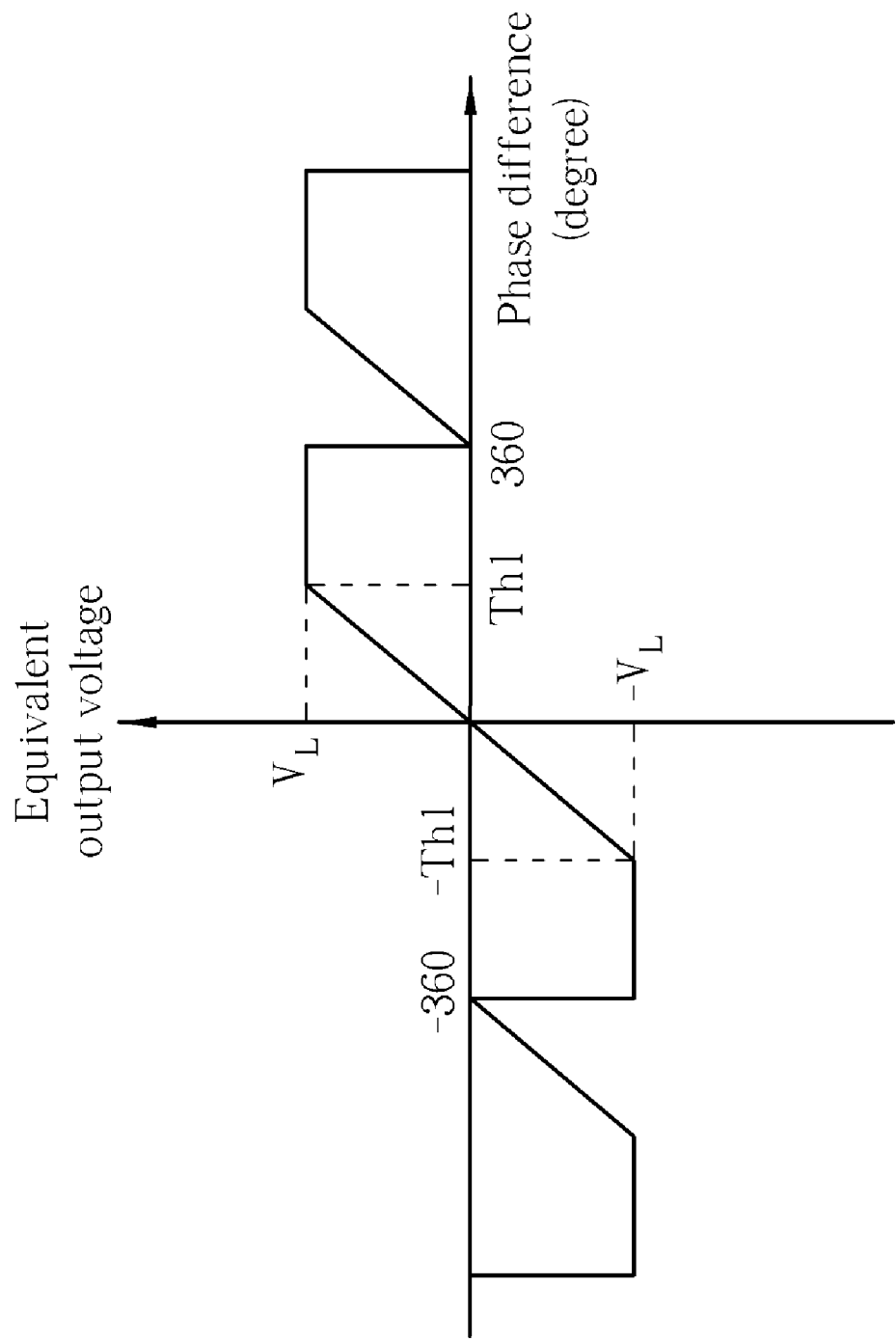
FIG. 4 is an illustration of the input-output characteristic of the phase frequency detector of FIG. 1 according to an exemplary embodiment.

FIG. 4 is an illustration of the input-output characteristic of the phase frequency detector 100 according to an exemplary embodiment. In FIG. 4, the x-axis is the degree of phase difference between the reference signal CLK_REF and the feedback signal CLK_FB and the y-axis is the equivalent output voltage of the phase frequency detector 100, which corresponds to the pulse width difference between the first output signal UP and the second output signal DN. As shown, when the degree of phase difference between the reference signal CLK_REF and the feedback signal CLK_FB is between −Th1 and Th1, the equivalent output voltage of the phase frequency detector 100 is proportional to the degree of phase difference. On the other hand, when the degree of phase difference between the reference signal CLK_REF and the feedback signal CLK_FB is located within an interval ranging from Th1 to 360, the equivalent output voltage of the phase frequency detector 100 is clamped at a predetermined value $V_L$. Similarly, the equivalent output voltage of the phase frequency detector 100 is clamped at another predetermined value $-V_L$ when the degree of phase difference between the reference signal CLK_REF and the feedback signal CLK_FB is between −Th1 and −360. The threshold degree Th1 is determined by the delay Td provided by the first and second delay units 150 and 160.

Since the equivalent output pulse width of the phase frequency detector 100 is clamped when the phase difference between the reference signal CLK_REF and the feedback signal CLK_FB is greater than the delay Td, the maximum output current generated by the charge pump following the phase frequency detector 100 is restricted at a certain value. It should be appreciated by those skilled in the art that the output voltage generated by a loop filter (not shown) following the charge pump is also clamped at a certain level when the phase difference T between the reference signal CLK_REF and the feedback signal CLK_FB is greater than the delay Td. As a result, the required capacitance of the loop filter for suppressing the jitter of the voltage-controlled oscillator (VCO) in the PLL is significantly reduced.

Please note that each of the first, second, and third control signals CS1, CS2, and CS3 in the foregoing embodiments are level trigger signals, however, this is merely a preferred embodiment rather than a restriction of the practical implementations. In practice, those control signals may be designed as edge trigger signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase frequency detector comprising:
   a first edge detector for detecting first-type edges of a first signal to generate a first detection signal;
   a second edge detector for detecting the first-type edges of a second signal to generate a second detection signal; and
   a pulse reshaping controller for receiving the first detection signal and the second detection signal, the pulse reshaping controller generating a first control signal to the first edge detector and generating a second control signal to the second edge detector, the pulse reshaping controller generating a first output signal and a second output signal;
   wherein a pulse width of the first output signal is limited by the pulse reshaping controller, where the pulse reshaping controller comprises:
      a first latch unit coupled to the first edge detector for latching the first detection signal to generate the first output signal;
      a first delay unit for delaying the first output signal to generate a first delayed signal;
      a second latch unit coupled to the second edge detector for latching the second detection signal to generate the second output signal; and
      a second delay unit for delaying the second output signal to generate a second delay signal;
      wherein the first delay signal is converted into the first control signal and the second delay signal is converted into the second control signal.

2. The phase frequency detector of claim 1, wherein the first latch unit is a D-type flip-flop.

3. The phase frequency detector of claim 1, wherein the second latch unit is a D-type flip-flop.

4. The phase frequency detector of claim 1, wherein the first edge detector is a D-type flip-flop.

5. The phase frequency detector of claim 1, wherein the second edge detector is a D-type flip-flop.

6. A phase frequency detector, comprising:
   a first edge detector for detecting an edge of a first signal to generate a first detection signal;
   a second edge detector for detecting an edge of a second signal to generate a second detection signal; and
   a pulse reshaping controller for generating a first output signal and a second output signal according to the first and the second detection signal, and generating a first control signal for controlling the first edge detector and a second control signal for controlling the second edge detector; wherein a pulse width difference between the first output signal and the second output signal represents an equivalent output pulse width;
   wherein the equivalent output pulse width is clamped when a phase difference between the first signal and the second signal exceeds a predetermined degree.

7. The phase frequency detector of claim 6, wherein the pulse reshaping controller further generates a first control signal to the first edge detector and a second control signal to the second edge detector, and the pulse reshaping controller comprises:
   a first latch unit coupled to the first edge detector for latching the first detection signal to generate the first output signal;
   a first delay unit for delaying the first output signal to generate a first delayed signal;
   a second latch unit coupled to the second edge detector for latching the second detection signal to generate the second output signal; and
   a second delay unit for delaying the second output signal to generate a second delay signal;
   wherein the first delay signal is converted into the first control signal and the second delay signal is converted into the second control signal.

8. The phase frequency detector of claim 7, wherein the first latch unit is a D-type flip-flop.

9. The phase frequency detector of claim 7, wherein the second latch unit is a D-type flip-flop.

10. The phase frequency detector of claim 6, wherein the first edge detector is a D-type flip-flop.

11. The phase frequency detector of claim 6, wherein the second edge detector is a D-type flip-flop.

12. A method for phase frequency detection utilized in a phase frequency detection circuit, the method comprising:
   generating a first output signal by detecting an edge of a first signal;
   generating a second output signal by detecting an edge of a second signal;
   generating a first control signal by delaying the first output signal;

generating a second control signal by delaying the second output signal;

resetting the first output signal according to the first control signal;

resetting the second output signal according to the second control signal; and limiting a pulse width difference between the first output signal and the second output signal according to at least the control signal.

13. The method of claim 12, wherein the delaying at least one of the first and the second output signal comprises: delaying the first output signal to generate the first control signal, and delaying the second output signal to generate the second control signal; and the step of limiting a pulse width difference between the first output signal and the second output comprises: limiting the pulse width difference between the first output signal and the second output signal according to the first control signal and the second control signal.

14. A phase frequency detector, comprising:

a first edge detector for detecting an edge of a first signal to generate a first detection signal;

a second edge detector for detecting an edge of a second signal to generate a second detection signal; and a pulse reshaping controller for generating a first output signal and a second output signal according to the first and the second detection signal, and generating a first control signal for controlling the first edge detector and a second control signal for controlling the second edge detector; wherein a pulse width difference between the first output signal and the second output signal represents an equivalent output pulse width;

wherein the equivalent output pulse width is clamped when a phase difference between the first signal and the second signal exceeds a predetermined degree;

wherein the pulse reshaping controller further generates a first control signal to the first edge detector and a second control signal to the second edge detector, and the pulse reshaping controller comprises:

a first latch unit coupled to the first edge detector for latching the first detection signal to generate the first output signal;

a first delay unit for delaying the first output signal to generate a first delayed signal;

a second latch unit coupled to the second edge detector for latching the second detection signal to generate the second output signal; and a second delay unit for delaying the second output signal to generate a second delay signal;

wherein the first delay signal is converted into the first control signal and the second delay signal is converted into the second control signal.

* * * * *